United States Patent
Jin et al.

(10) Patent No.: US 9,360,527 B2
(45) Date of Patent: Jun. 7, 2016

(54) SYSTEM AND METHOD FOR ENERGY PREDICTION IN BATTERY PACKS

(75) Inventors: Zhihong H. Jin, Pewaukee, WI (US); Matthew D. Elberson, Menomonee Falls, WI (US); David R. Boone, Waukesha, WI (US); Uday S. Kasavajjila, Fox Point, WI (US)

(73) Assignee: Johnson Controls Technology LLC, Wilmington, DE (US)

( * ) Notice: Subject to any disclaimer, the term of this patent is extended or adjusted under 35 U.S.C. 154(b) by 277 days.

(21) Appl. No.: 13/571,133

(22) Filed: Aug. 9, 2012

(65) Prior Publication Data

US 2013/0041538 A1    Feb. 14, 2013

Related U.S. Application Data

(60) Provisional application No. 61/523,137, filed on Aug. 12, 2011.

(51) Int. Cl.
| | |
|---|---|
| *G01R 31/36* | (2006.01) |
| *B60W 10/26* | (2006.01) |
| *B60W 10/08* | (2006.01) |
| *B60W 20/00* | (2016.01) |

(Continued)

(52) U.S. Cl.
CPC ............ *G01R 31/3606* (2013.01); *B60L 11/123* (2013.01); *B60L 11/14* (2013.01); *B60L 11/1857* (2013.01); *B60L 11/1866* (2013.01); *B60L 11/1877* (2013.01); *B60L 11/1879* (2013.01); *B60L 2240/545* (2013.01); *B60L 2240/547* (2013.01); *B60L 2240/549* (2013.01); *B60L 2250/16* (2013.01); *B60L 2250/18* (2013.01); *B60L 2260/52* (2013.01); *B60L 2260/54* (2013.01); *G01R 31/3651* (2013.01); *G01R 31/3662* (2013.01); *Y02T 10/6217* (2013.01); *Y02T 10/7005* (2013.01); *Y02T 10/7061* (2013.01); *Y02T 10/7077* (2013.01)

(58) Field of Classification Search
CPC ........ B60W 10/08; B60L 20/00; B60L 11/123
USPC ................................ 701/22; 324/427; 903/930
See application file for complete search history.

(56) References Cited

U.S. PATENT DOCUMENTS 6,061,639 A * 5/2000 Wistrand ................. 702/63
6,653,016 B2   11/2003 Maske et al.

(Continued)

FOREIGN PATENT DOCUMENTS

| | | |
|---|---|---|
| EP | 2216199 A2 | 8/2010 |
| JP | 2005253287 A | 9/2005 |
| RU | 2289178 C2 * | 12/2006 |

OTHER PUBLICATIONS

Thornton, Jack, Charging Forward, Mechanical Engineering, Aug. 2012, pp. 36-39.

(Continued)

*Primary Examiner* — Redhwan K Mawari
*Assistant Examiner* — Rodney P King
(74) *Attorney, Agent, or Firm* — Fletcher Yoder, P.C.

(57) ABSTRACT

In an embodiment, a system includes a battery management unit (BMU) coupled to a battery pack of an xEV. Further, the BMU is configured to determine an energy remaining value for the battery pack based, at least in part, on a minimum cell temperature and a minimum cell state of charge percentage (SOC %) determined by the BMU for the battery pack.

46 Claims, 7 Drawing Sheets

(51) Int. Cl.
*G06F 7/00* (2006.01)
*B60W 10/06* (2006.01)
*B60L 11/18* (2006.01)
*B60L 11/12* (2006.01)
*B60L 11/14* (2006.01)

(56) References Cited

U.S. PATENT DOCUMENTS

| | | | |
|---|---|---|---|
| 6,818,347 | B1 | 11/2004 | Jin et al. |
| 7,489,106 | B1* | 2/2009 | Tikhonov ................ 320/116 |
| 7,612,538 | B2 | 11/2009 | Cho et al. |
| 7,645,540 | B2 | 1/2010 | Boone et al. |
| 7,680,613 | B2 | 3/2010 | Lim et al. |
| 7,688,075 | B2 | 3/2010 | Kelley et al. |
| 7,740,984 | B2 | 6/2010 | Bushong et al. |
| 7,763,384 | B2 | 7/2010 | Boone et al. |
| 7,931,981 | B2 | 4/2011 | Boone et al. |
| 8,963,506 | B2 | 2/2015 | Miyazawa et al. |
| 2005/0026031 | A1 | 2/2005 | McKenzie et al. |
| 2005/0084755 | A1 | 4/2005 | Boone et al. |
| 2005/0088145 | A1* | 4/2005 | Loch ..................... 320/132 |
| 2005/0189919 | A1* | 9/2005 | Tsuchiya et al. ......... 320/132 |
| 2006/0115738 | A1 | 6/2006 | Sazhin et al. |
| 2006/0238203 | A1* | 10/2006 | Kelley et al. ............ 324/433 |
| 2006/0257728 | A1 | 11/2006 | Mortensen et al. |
| 2007/0139013 | A1 | 6/2007 | Seo et al. |
| 2007/0257016 | A1 | 11/2007 | Jin et al. |
| 2008/0091363 | A1 | 4/2008 | Lim et al. |
| 2008/0191663 | A1* | 8/2008 | Fowler et al. ............ 320/118 |
| 2009/0040033 | A1 | 2/2009 | Uchida |
| 2010/0152941 | A1* | 6/2010 | Skaff et al. ............... 701/22 |
| 2010/0188043 | A1* | 7/2010 | Kelty et al. ............. 320/109 |
| 2011/0269008 | A1 | 11/2011 | Houchin-Miller et al. |
| 2011/0309796 | A1* | 12/2011 | Firehammer ............ 320/118 |

OTHER PUBLICATIONS

International Search Report and Written Opinion for PCT Application PCT/US2012/058489 dated Feb. 19, 2014; 10 pgs.
CN Office Action dated Jun. 3, 2015, 2 Pages.

\* cited by examiner

SYSTEM AND METHOD FOR ENERGY PREDICTION IN BATTERY PACKS

This application claims the benefit of U.S. Provisional Patent Application Ser. No. 61/523,137, entitled "SYSTEM AND METHOD FOR ENERGY PREDICTION OF BATTERY PACKS," filed on Aug. 12, 2011, which is herein incorporated by reference in its entirety for all purposes.

BACKGROUND

The present application relates generally to battery systems for any vehicle deriving at least a portion of its motive power from an electric power source (i.e., xEVs).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Vehicles, such as cars, trucks, vans, are widely used to facilitate the movement of people and goods in modern society. Vehicles may utilize a number of different energy sources (e.g., a hydrocarbon fuel, a battery system, a capacitance system, a compressed air system) in order to produce motive power. In particular, the term "xEV" may be used to describe any vehicle that derives at least a portion of its motive power from an electric power source (e.g., a battery system). For example, electric vehicles (EVs), which may also be referred to as all-electric vehicles, typically include a battery system and use electric power for all of their motive power. As such, EVs may be principally dependent on a plug-in power source to charge a battery system, while other power generation/conservation systems (e.g., regenerative braking systems) may help extend the life of the battery and the range of the EV during operation.

Two specific sub-classes of xEV are the hybrid electric vehicle (HEV) and the plug-in hybrid electric vehicle (PHEV). Both the HEV and the PHEVs generally include an internal combustion engine in addition to a battery system. For the PHEV, as the name suggests, the battery system is capable of being charged from a plug-in power source. A series hybrid vehicle (e.g., a series PHEV or HEV) uses the internal combustion engine to turn a generator that, in turn, supplies current to an electric motor to move the vehicle. In contrast, a parallel hybrid (e.g., a parallel PHEV or HEV) can simultaneously provide motive power from an internal combustion engine and a battery powered electric drive system. That is, certain xEVs may use electrical energy stored in the battery system to boost (i.e., provide additional power to) the powertrain of the vehicle. Furthermore, xEVs (e.g., PHEVs and HEVs) may take advantage of opportunistic energy capture (e.g., via regenerative braking systems or similar energy conservation systems) in addition to using at least a portion of the power from the engine to charge the battery system.

In general, xEVs may provide a number of advantages as compared to traditional, gas-powered vehicles that solely rely on internal combustion engines for motive power. For example, xEVs may produce fewer undesirable emission products and may exhibit greater fuel efficiency as compared to vehicles using only internal combustion engines to propel the vehicle. Furthermore, for some xEVs, such as all-electric EVs that lack an internal combustion engine, the use of gasoline may be eliminated entirely.

As xEV technology continues to evolve, there is a need to provide improved power sources (e.g., battery systems) for such vehicles. That is, it is generally desirable to increase the distance that such vehicles may travel without the need to recharge the batteries. It is also desirable to improve the performance of such batteries and to reduce the cost associated with the battery systems. The battery systems of early electric vehicles employed nickel-metal-hydride (NiMH) cells. Over time, different additives and modifications have improved the performance, reliability, and utility of NiMH batteries. More recently, some manufacturers have moved toward lithium-ion batteries for use in xEVs. There may be several advantages associated with using lithium-ion batteries for vehicle applications. For example, lithium-ion batteries have a higher charge density and specific power than NiMH batteries. In other words, lithium-ion batteries may be smaller and lighter than NiMH batteries while storing an equivalent amount of charge. For xEVs, smaller, lighter battery systems may allow for weight and space savings in the design of the xEV and/or allow manufacturers to provide a greater amount of power for the vehicle without increasing the weight of the vehicle or the space taken up by the battery system.

Just as the chemistry of the battery systems has developed, so have the electronics (e.g., battery control units) that monitor and control these battery systems. For example, since lithium-ion batteries may be more susceptible to variations in battery temperature than comparable NiMH batteries, more complex electronic systems (e.g., temperature sensors, logic units, etc.) may be used to monitor and regulate the temperatures of the lithium-ion battery systems, even as the temperature of the battery system fluctuates during operation of the xEV. Furthermore, as both NiMH and lithium-ion battery cells age, they may generally store less charge and/or provide a lower output current than at their beginning of life (BOL).

SUMMARY

Present embodiments include systems and methods for determining the energy remaining in a battery system (e.g., a battery pack) of an xEV. In an embodiment, a system includes a battery pack including a controller in the form of a battery management unit (BMU). The BMU may be configured to monitor parameters of the battery pack (e.g., minimum cell state of charge percentage, minimum cell temperature, current, and/or other suitable parameters). Further, the BMU may be configured to determine certain parameters (e.g., cell resistance aging factor, cell actual capacity, average cell voltage, discharge resistance, discharge voltage, and other similar parameters) of the battery pack based, at least in part, on the monitor parameters. Additionally, in certain embodiments, the BMU may receive additional information (e.g., a driving profile weighting factor or other suitable information) from a vehicle control unit (VCU) in order to perform these calculations. In certain embodiments, the BMU may have access to tables of data (e.g., look-up tables) that the BMU may use and determining the various parameters of the battery pack. In particular, the BMU is configured to determine (e.g., estimate or predict) the energy remaining in the battery pack. In certain embodiments, the BMU may be configured to provide the energy remaining value to the VCU, and the VCU may use the energy remaining value to determine other parameters of the xEV (e.g., distance and/or time the xEV may travel using the energy remaining, distance and/or time the xEV may travel using the energy remaining and other fuel sources, and so forth) for display to the driver on an instrument cluster.

In another embodiment, a system includes an xEV having a VCU and a battery pack, which includes a BMU. The BMU may be configured to monitor parameters of the battery pack (e.g., minimum cell state of charge percentage, minimum cell temperature, battery pack temperature, discharge current, and/or other suitable parameters). Further, the BMU may be configured to communicate the monitored parameters to the VCU such that the VCU may determine other parameters (e.g., cell resistance aging factor, average cell voltage, discharge resistance, discharge voltage, and other similar parameters) of the battery pack based, at least in part, on the monitored parameters. In certain embodiments, the VCU may have access to tables of data (e.g., look-up tables) that the VCU may use and determining the various parameters of the battery pack. In particular, the VCU is configured to determine (e.g., estimate or predict) the energy remaining in the battery pack. In certain embodiments, the BMU and the VCU may cooperate and calculating one or more parameters of the battery pack, such as energy remaining. Furthermore, in certain embodiments, the VCU may use the energy remaining value to determine other parameters of the xEV (e.g., distance and/or time the xEV may travel using the energy remaining, distance and/or time the xEV may travel using the energy remaining and other fuel sources, and so forth) for display to the driver on an instrument cluster.

BRIEF DESCRIPTION OF THE DRAWINGS

Various aspects of this disclosure may be better understood upon reading the following detailed description and upon reference to the drawings in which.

DETAILED DESCRIPTION

Figure 1:
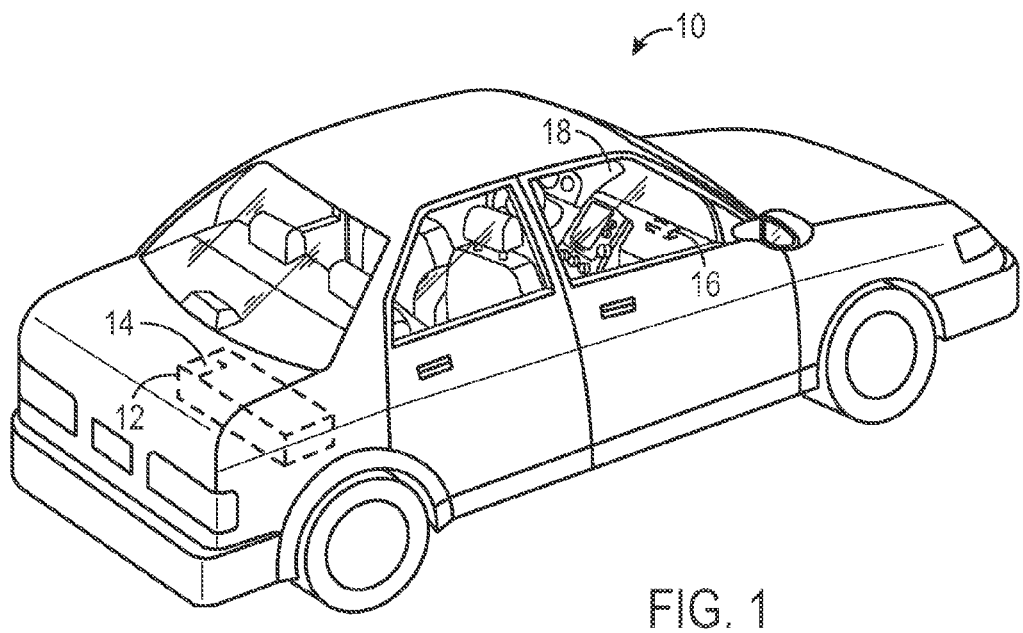
FIG. 1 is a perspective view of an xEV including an instrument cluster, a vehicle control unit (VCU), and a battery pack having a battery management unit (BMU), in accordance with an embodiment of the present technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

For the purposes of the present disclosure, it should be noted that the presently disclosed embodiments are particularly directed toward applications for xEV electric vehicles. As will be appreciated by those skilled in the art, hybrid electric vehicles (HEVs) combine an internal combustion engine propulsion and high voltage battery power to create traction. A plug-in electric vehicle (PEV) is any vehicle that can be charged from an external source of electricity, such as wall sockets, and the energy stored in the rechargeable battery packs drives or contributes to drive the wheels. PEVs are a subcategory of electric vehicles that include all-electric or battery electric vehicles (BEVs), plug-in hybrid vehicles (PHEVs), and electric vehicle conversions of hybrid electric vehicles and conventional internal combustion engine vehicles. An electric vehicle (EV) is an all-electric vehicle that uses for its propulsion one or more motors powered by electric energy. The term "xEV" is defined herein to include all of the foregoing or any variations or combinations thereof that include electric power as a motive force.

As set forth above, battery packs for xEVs may include an electronic controller, such as a battery management unit (BMU), to monitor various parameters associated with the operation of the battery pack. For example, a BMU may monitor the temperature, pressure, current, voltage, capacity, and so forth, for the various battery modules and electrochemical cells (e.g., NiMH and/or lithium-ion cells) of the battery pack using a number of sensors distributed throughout the battery pack. Additionally, the BMU may communicate the monitored parameters of the battery pack to a vehicle control unit (VCU), which may generally monitor the operation of the xEV and inform the driver and/or make adjustments to the operation of the xEV in response to the monitoring (e.g., notifying a driver of a low-battery pack condition via an instrument cluster).

Furthermore, the BMU and/or the VCU may also estimate or predict other parameters of the battery pack based upon the parameters monitored by the BMU. For example, it may be desirable for a BMU or a VCU of an xEV to be able to determine (e.g., predict or estimate) how much energy remains in the battery pack of an xEV at a particular time. However, the amount of energy remaining in the battery pack of the xEV at any particular time depends on a number of factors, including, for example, temperature, discharge current, capacity, and state of charge (SOC) of the battery pack, among other things. As such, it may be challenging for the BMU or VCU of the xEV to predict or estimate how much energy remains in the battery pack.

Accordingly, present embodiments are directed toward systems and methods for determining the energy remaining in an xEV battery pack based on the battery pack's monitored parameters and the presently disclosed mathematical model. As set forth below, present embodiments include an xEV having a BMU and/or VCU capable of executing instructions (e.g., software) using a processor to determine how much energy remains in the battery pack of the xEV. Furthermore, certain presently disclosed embodiments demonstrate using the determine value for the energy remaining in the battery pack to determine other information about the performance of the xEV (e.g., an estimated time and/or range remaining for the battery pack, a total time and/or range including fuel for hybrid vehicles, and so forth) to provide the driver with a more informed driving experience.

With the foregoing in mind, FIG. 1 is a perspective view of an xEV 10, in accordance with an embodiment of the present approach. The illustrated xEV 10 may be any type of vehicle having a battery system for providing at least a portion of the motive power to propel the vehicle. For example, the xEV 10 may be an all-electric vehicle (EV), a hybrid electric vehicle (HEV), a plug-in hybrid electric vehicle (PHEV), or other type of vehicle using electric power to provide at least a portion of the propulsion for the vehicle. Although xEV 10 is illustrated as a car in FIG. 1, in other embodiments, other types of vehicle may be used with the present technique. For example, in other embodiments, the xEV 10 may be a truck, bus, industrial vehicle, motorcycle, recreational vehicle, boat, or any other type of vehicle that may move, at least partially, using electric power. Accordingly, xEV 10 includes a battery pack 12 capable of supplying electrical power to the xEV 10 that may be used to move the xEV 10, in addition to powering other features of the xEV 10 (e.g., lights, automatic windows, automatic locks, entertainment systems, and similar components and accessories of the xEV 10). It should be appreciated that the term "battery pack" as used herein may generally refer to a battery system, such as the modular battery system discussed below with respect to FIG. 4, which includes a number of electrochemical cells and a BMU 14. It should also be appreciated that, in other embodiments, the BMU 14 may be a separate component (e.g., part of the xEV 10) that is coupled to the battery pack 12 upon installation without spoiling the effect of the present approach. Furthermore, although the battery pack 12 illustrated in FIG. 1 is positioned in the trunk or rear of the xEV 10, in other embodiments, the battery pack 12 may be positioned elsewhere in the xEV 10. For example, battery pack 12 may be positioned based on the available space within the xEV 10, the desired weight balance of the xEV 10, the location of other components used with the battery pack 12 (e.g., battery management systems, vents or cooling devices, or similar systems), and similar engineering considerations.

In addition to the battery pack 12, including the BMU 14, the illustrated xEV 10 also has a vehicle control unit (VCU) 16. As mentioned above, the VCU 16 may generally monitor and control certain parameters of the xEV 10. For example, the VCU 16 may use a number of sensors to monitor the temperature inside the xEV 10, the temperature outside the xEV 10, the speed of the xEV 10, the load on the electric motor, and so forth. In certain embodiments, the VCU 16 may include sensors disposed about the xEV 10 to detect when a component of the xEV 10 is operating outside of a desired range (e.g., engine failure, transmission failure, battery failure, and so forth) and may, furthermore, notify the driver and/or disable components of the xEV 10 in response. For hybrid xEVs that include an internal combustion engine, such as HEVs and PHEVs, the VCU 16 may also monitor and control parameters of the internal combustion engine (e.g., oxygen content at the air intake, atmospheric pressure, remaining fuel, revolutions per minute, coolant temperature, and other factors affecting the performance and operation of the internal combustion engine) as well.

As mentioned, the VCU 16 may, at times, desire to inform the driver of the xEV 10 about information regarding the operation and performance of the xEV 10. As such, the illustrated xEV 10 includes an instrument cluster 18. It should be appreciated that the illustrated instrument cluster 18 is disposed in front of the driver seat, while, in other embodiments, the instrument cluster 18 may be disposed elsewhere (e.g., a center console) without spoiling the effect of the present technique. The instrument cluster 18 may provide the driver with one or more indicators related to the status and condition of the xEV 10 based on instructions from the VCU 16.

Figure 2:
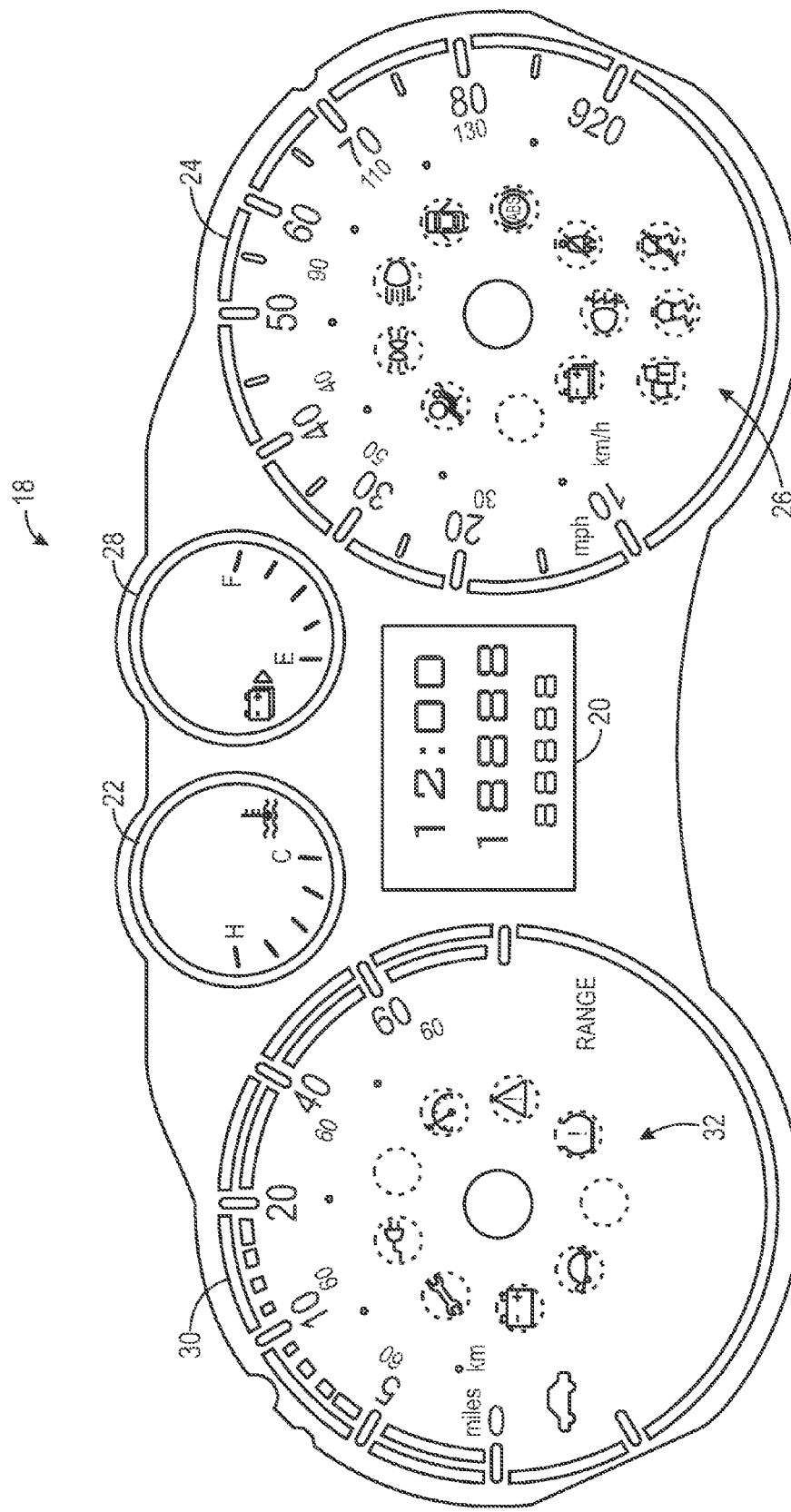
FIG. 2 is a perspective view of the instrument cluster of the xEV illustrated in FIG. 1, in accordance with an embodiment of the present technique.

FIG. 2 illustrates an enlarged view of the instrument cluster 18 of FIG. 1. The instrument cluster 18 illustrated in FIG. 2 includes a number of gauges and warning lamps surrounding an LCD screen 20. The illustrated LCD screen 20 may display various textual information (e.g., time, mileage for the vehicle, trip mileage, and the like) to the driver of the xEV 10. The illustrated instrument cluster 18 includes a temperature gauge 22 and a speedometer 24, similar to those disposed in other vehicles. Additionally, the illustrated instrument cluster 18 includes warning lamps 26 that generally inform the driver about the state of the xEV 10 (e.g., high beam lights engaged, low-beam lights engaged, seatbelt engaged or disengaged, advanced fraction engaged or disengaged, antilock braking system engaged or disengaged, airbag engaged or disengaged, electrical problems, and so forth) to inform the driver about features or issues of the xEV 10 during operation.

More particular to xEVs, the illustrated instrument cluster 18 includes a battery gauge 28, a range gauge 30, and a set of warning lamps 32 that correspond to different electrical issues the xEV 10 may experience. Like other portions of the instrument cluster 18, battery gauge 28, range gauge 30, and warning lamps 32 may be controlled by the VCU 16. Furthermore, as set forth below, the VCU 16 may control these gauges and warning lamps based on various calculations derived from monitoring the parameters of the battery pack 12. Similar to a fuel gauge of a typical internal combustion vehicle, the battery gauge 28 of the illustrated instrument cluster 18 includes two extreme conditions (i.e., "F" for maximum charge, "E" for minimum charge) with a number of indicia or ticks disposed therebetween such that an indicator (e.g., a needle or other suitable indicator) may inform the driver of the state of charge (SOC) of the battery pack 12 of the xEV 10. The SOC of the battery pack 12, generally represented as a percentage, is indicative of the amount of charge stored in the battery pack 12. In other embodiments, the battery gauge 28 may be a digital gauge illustrating a linear or curved bar, the length of which is based on the SOC of the vehicle as determined by the VCU 16 and/or BMU 14. For example, a SOC of 100% may correspond to an "F" indicator and a 10% SOC (e.g., a minimum cell SOC for the battery pack or lower limit SOC %) may correspond to an "E" indicator with a linear scale between the "F" and "E" indicia (e.g., a half-way tick between "F" and "E" may correspond to about 55% SOC). In certain embodiments (e.g., where the xEV 10 is a PHEV or HEV) the instrument cluster 18 may include a fuel gauge (e.g., for gasoline or diesel), a gauge indicating a combination of the charge in the battery packs and the fuel level (e.g., a total capacity gauge), or other suitable gauges, warning lamps, or indicators.

In addition to the battery gauge 28, the instrument cluster 18 illustrated in FIG. 2 also includes a set of warning lamps 32 that correspond to different electrical issues the xEV 10 may experience. For example, the illustrated warning lamps 30 to include a "low charge" warning lamp (e.g., a plug symbol) that may illuminate at a particular threshold low SOC (e.g., near the minimum cell SOC of the battery pack 12) or threshold remaining range, as discussed below. Additionally, the instrument cluster 18 may include a "limited power" warning lamp 32 (e.g., a turtle symbol or similar symbol) that illuminates to indicate that power being supplied from the battery pack 12 is limited, which may slow the vehicle. Furthermore, the warning lamps 32 may include, for example, warning lamps that flash to indicate limited time remaining before the battery pack 12 or the xEV 10 needs to be serviced, warning lamps to indicate that the battery pack 12 is not functioning properly, warning lamps to indicate that the battery pack 12 has failed completely, or similar warning lamps.

Additionally, the illustrated instrument cluster 18 also includes a range gauge 30. The illustrated range gauge 30 includes indicia or ticks such that an indicator (e.g., a needle or other suitable indicator) may inform the driver of the remaining energy in the battery pack 12, indicated as a measure of distance and/or time. In other embodiments, the range gauge 30 may be a digital gauge illustrating a linear or curved bar, the length of which is proportional to the remaining energy in the battery pack 12, or other suitable representation. Furthermore, in certain embodiments, the range gauge 30 may use a non-linear scale to convey the remaining range with greater accuracy and to provide more resolution when the battery is at a lower SOC. In general, the range gauge 30 provides a distance to empty (DTE) value, or a distance the xEV 10 may be able to travel based on the energy remaining in the battery pack 12. The distance indicated by the range gauge 30 may be calculated by the VCU 16. Furthermore, as set forth below, the distance indicated by the range gauge 30 may be based upon an energy remaining calculation performed by the VCU 16 and/or BMU 14 based, at least in part, upon monitored parameters (e.g., SOC %, temperature, discharge current, etc.) of the battery pack 12. It should be appreciated that, in for hybrid xEV embodiments, the range gauge 30 may also include a range that considers the remaining fuel (e.g., the remaining energy that may be retrieved from the remaining fuel), in addition to the remaining energy in the battery pack 12.

Figure 3:
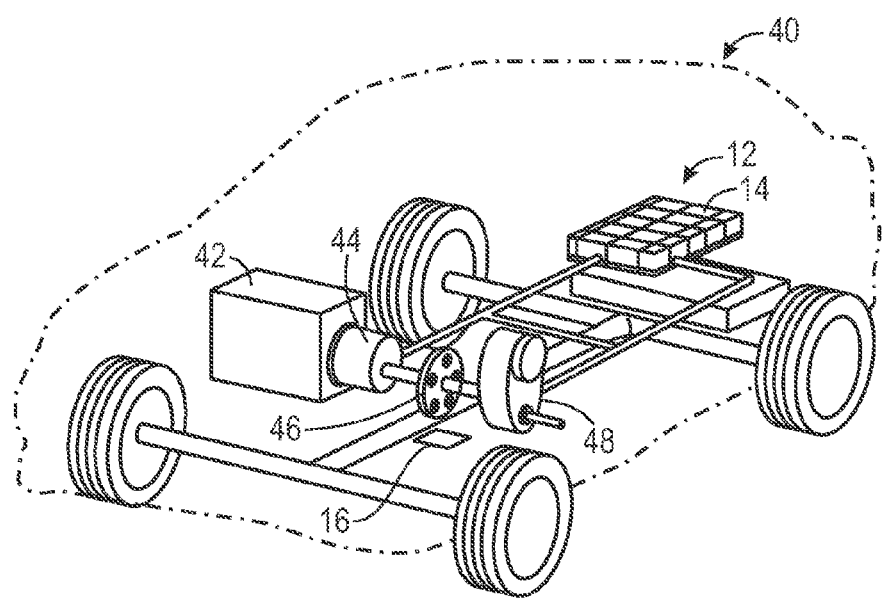
FIG. 3 is a cutaway schematic view of a hybrid electric vehicle (HEV) including a battery pack having a BMU, in accordance with an embodiment of the present technique.

For example, FIG. 3 illustrates a cutaway schematic view of an xEV in the form of a HEV 40, in accordance with an example embodiment of the present approach. Like the xEV 10 illustrated in FIG. 1, the HEV 40 illustrated in FIG. 3 includes a battery pack 12 toward the rear of the HEV 40, proximate a fuel tank. In other embodiments, the battery pack 12 may be disposed in a separate compartment in the rear of the vehicle (e.g., a trunk), or another suitable location. Additionally, the HEV 40 includes an internal combustion engine 42, which may combust a hydrocarbon fuel to produce power that may be used to propel the HEV 40. Also, the HEV 40 is equipped with an electric motor 44 that is coupled to the battery pack 12 and is also used to propel the HEV 40. The illustrated HEV 40 is also equipped with a power split device 46, which allows a portion of the power (e.g., rotational energy) to be directed to a generator 48 suitable for charging the battery pack 12. It should be noted that other types of xEVs (e.g., EVs, HEVs, PHEVs, etc.) and other configurations (e.g., the type of vehicle, the type of vehicle technology, and the battery chemistry, among other configurations) may be used in various embodiments of the present approach.

Figure 4:
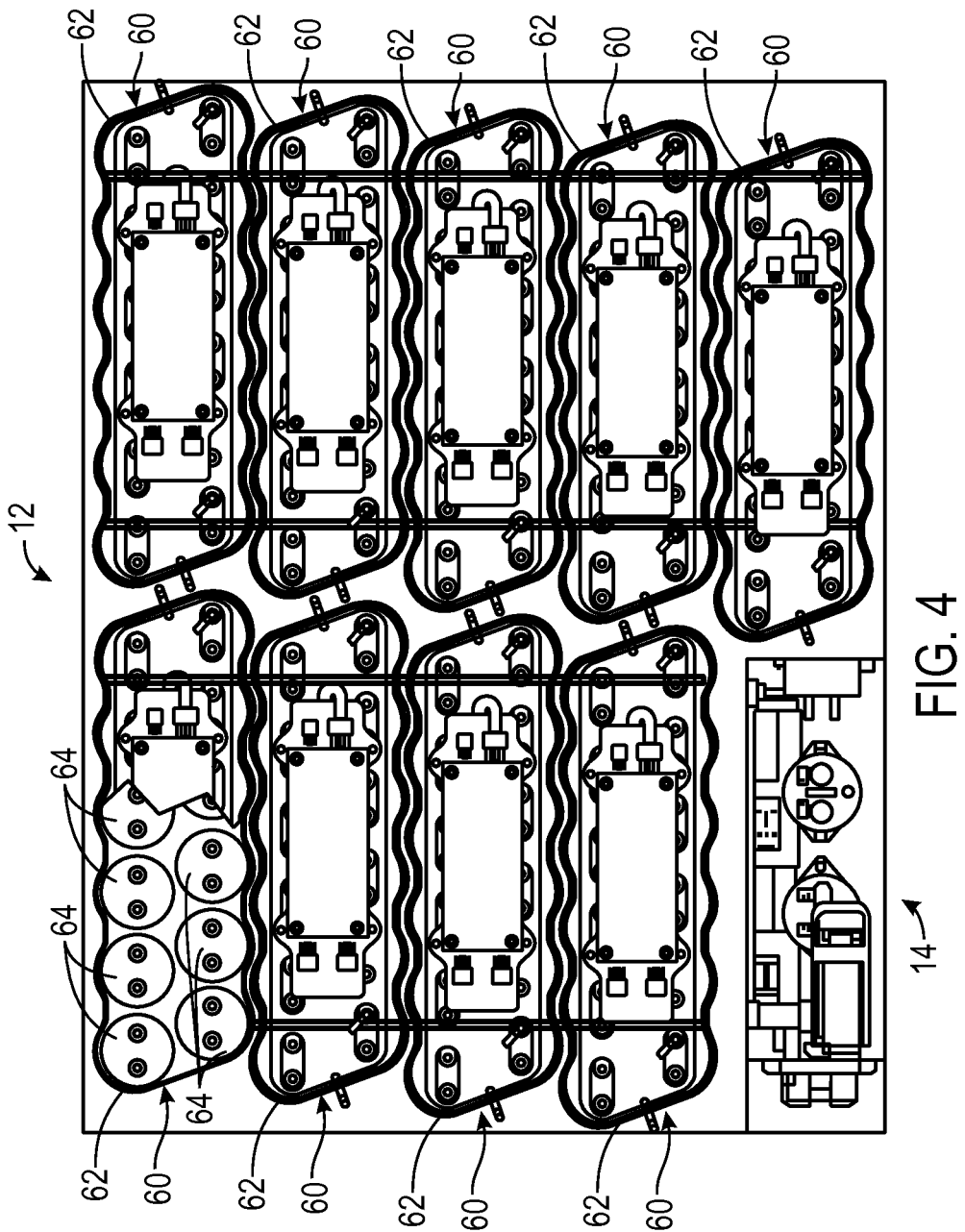
FIG. 4 is a top view of a battery pack having a BMU, in accordance with an embodiment of the present technique.

FIG. 4 illustrates one example of a battery pack 12 in accordance with an embodiment of the present approach. Generally speaking, the illustrated battery pack 12 couples individual battery modules 60 to one another and to other components of the vehicle electrical system. As illustrated in FIG. 4, the battery pack 12 includes 9 battery modules 60 disposed within a housing 62. Furthermore, each illustrated battery module 60 includes 12 cylindrical electrochemical cells 64 (e.g., lithium-ion cells, nickel-metal-hydride cells, lithium polymer cells, etc., or other suitable types of electrochemical cells) coupled to one another in series and/or in parallel based on the power requirements of the battery pack 12. It should be appreciated that the example illustrated in FIG. 4 is not intended to be limiting, and any number of configurations or arrangements of battery modules 60 and/or electrochemical cell 64 may be possible within the battery pack 12. For example, in certain embodiments, the electrochemical cells 64 may be prismatic lithium-ion cells, while in other embodiments the electrochemical cells 64 may have other physical configurations (e.g., oval, cylindrical, polygonal, etc.). By further example, the cells may also be arranged vertically, arranged into several separate groups, or arranged in other suitable configurations. Furthermore, different numbers and types (e.g., nickel-metal-hydride, etc.) of electrochemical cell 64 may be used. Additionally, the housing 62 may include features (e.g., sidewalls, etc.) that are intended to receive and arrange the cells.

Additionally, the BMU 14 of the battery pack 12 illustrated in FIG. 4 may generally monitor and regulate the various battery modules 60. For example, the BMU 14 may monitor and control the electrical performance of the battery pack 12, manage the thermal behavior of the system, manage the containment and/or routing of effluent (e.g., gases that may be vented from a battery cell) from a battery module 60 and/or the battery pack 12, and other suitable aspects of the battery pack 12. Furthermore, as set forth below, the BMU 14 may calculate various parameters of the battery pack 12 (e.g., discharge voltage, remaining SOC %, and/or energy remaining), based in part on the monitored or measured parameters of the battery pack 12 (e.g., temperature, minimum cell SOC %, calendar or charging age of the battery pack 12).

Returning briefly to FIG. 3, the HEV 40 may include a VCU 16 that may desire to determine the amount of energy remaining in the battery pack 12 (e.g., the battery pack illustrated in FIG. 4). Further, the HEV 40 may be powered by just the battery pack 12, by just the engine 42, or by both the battery pack 12 and the engine 42. It should therefore be appreciated that when the VCU 16 desires to determine the remaining range for the HEV 40, the VCU 16 may consider a number of factors. For example, the VCU 16 may consider, among other things, the energy remaining in the battery pack 12, the fuel remaining in the internal combustion engine 42, and the driving style of the driver when determining the remaining range of the HEV 40 (e.g., for display on the range gauge 30 of the instrument cluster 18).

Figure 5:
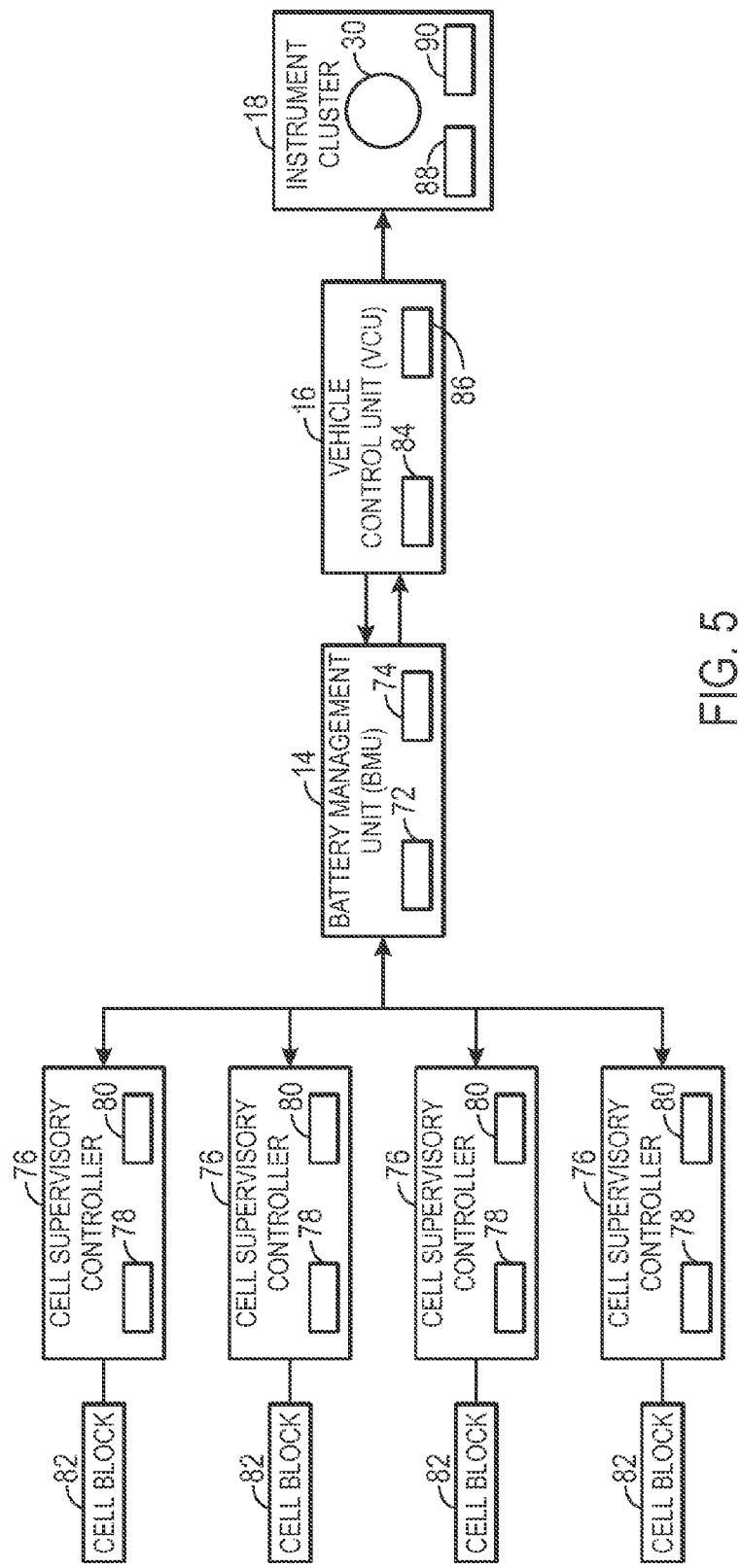
FIG. 5 is schematic illustrating communication between the BMU, the battery modules, and the VCU, in accordance with an embodiment of the present technique.

With the foregoing in mind, FIG. 5 is a schematic illustrating communication between the BMU 14 and the VCU 16 within an xEV (e.g., xEV 10 or HEV 40) for an embodiment of the present approach. It should be appreciated that, in certain embodiments, the VCU 16 may execute an energy remaining module to determine the energy remaining in the battery pack 12 based on information received from the BMU 14. In other embodiments, the BMU 14 may execute an energy remaining module to determine the energy remaining and, subsequently, inform the VCU 16 of the determined value. As set forth below, the VCU 16 may then perform other calculations using the energy remaining value and/or display the energy remaining value to the driver on the instrument cluster 18.

In the communication system 70 illustrated in FIG. 5, the BMU 14 includes a memory 72 (e.g., ROM, RAM, flash memory, cache, a combination thereof, or other suitable computer or machine-readable memory or media) capable of storing instructions (e.g., software), mathematical formulas and/or equations, look-up tables, and the like. Further, the illustrated BMU 14 also includes a processor 74 which may be any suitable microprocessor capable of executing instructions stored in the memory 72 and/or performing calculations. As set forth above, the BMU 14 may generally receive information from sensors disposed throughout the battery pack 12. Further, FIG. 5 illustrates the BMU 14 communicatively coupled to a number of cells supervisory controllers 76 disposed throughout the battery pack 12. In certain embodiments, a cell supervisory controller 76 may control each battery module 60 of the battery pack 12, control groups of battery modules 60, or control individual or groups of electrochemical cells 64 (as illustrated in FIG. 4) based on instructions from the BMU 14.

Accordingly, for the communication system 70 illustrated in FIG. 5, each cell supervisory controller 76 may include a memory 78 and a processor 80, which may be similar to one or more of the memories or processors, respectively set forth above with respect to the BMU 14. Further, each cell supervisory controller 76 illustrated in FIG. 5 is communicatively coupled to a cell block 82, which may include any number of electrochemical cells 64 and/or battery modules 60, such that the cell supervisory controllers 76 may receive information regarding the parameters of the corresponding cell block 82 (e.g., from temperature, pressure, voltage sensors, etc., disposed within the cell block 82) and provide this information to the BMU 14. These parameters, including, for example, a cell temperature, pressure, SOC %, cell capacity, discharge current, and so forth, may be provided to the BMU 14 such that the BMU 14 may determine other parameters of the battery pack 12 (e.g., average cell voltage, discharge resistance, etc.).

For example, the BMU 14 may determine a minimum (e.g., lowest) cell temperature for the battery pack 12 based on the various cell temperatures provided by the cell supervisory controllers 76 (e.g., using a comparison operation or a comparator circuit). Further, the BMU 14 may determine a minimum (e.g., lowest) cell SOC % based on the various SOC % values provided by the cell supervisory controllers 76. Additionally, the memory 72 of the BMU 14 may store other information regarding the battery pack 12. For example, this information may include the BOL capacity of the electrochemical cells 64, battery modules 60, and/or the battery pack 12, an average temperature for the battery pack 12, a lower limit SOC % for the battery pack 12 (e.g., a minimal state of charge that the battery pack 12 should maintain), a discharge current to the battery pack 12, information regarding the calendar life and/or cycle life of the battery pack 12, the resistance of both the electrochemical cells 64 and non-battery cell components of the battery pack 12 (actual and BOL), the current minimum cell SOC % of the battery pack 12, and so forth. Further, in certain embodiments, the memory 72 of the BMU 14 may store a driving profile weighting factor (e.g., derived by and received from the VCU 16) relating to the driving style (e.g., aggressive, passive, economical, etc.) and/or type of driving (e.g., highway, stop-and-go, towing, etc.) that is typical for a particular driver or for the xEV for use in the computations.

The VCU 16 illustrated in the communication system 70 of FIG. 5 includes a memory 84 and a processor 86, which may be similar to one or more of the types of memories or processors respectively discussed above with respect to the BMU 14. Further, as set forth above, the VCU may be communicatively coupled to the instrument cluster 18 in order to communicate information (e.g., energy remaining in the battery pack, remaining range of the xEV in time and/or distance, and so forth) to the instrument cluster 18 for display to the driver (e.g., using the range gauge 30 of the instrument cluster 18). Accordingly, in certain embodiments, the instrument cluster may also include memory 88 and a processor 90 to process information for display to the driver. In other embodiments, the instrument cluster 18 may lack a processor 90 and/or memory 88 and may rely on the VCU 16 to process information for display.

Furthermore, in certain embodiments, the memory 84 and the processor 86 of the VCU 16 illustrated in FIG. 5 may, additionally or alternatively, store some or all of the information regarding the battery pack 12 set forth above with respect to the memory 72 of the BMU 14. That is, in certain embodiments, the BMU 14 may communicate one or more of these parameters to the VCU 16 such that the VCU 16 may perform one or more calculations (e.g., energy remaining) regarding the battery pack 12. Furthermore, it should be appreciated that, in certain embodiments, the BMU 14 and the VCU 16 may cooperate in the performance of one or more calculations, such as determining the energy remaining in the battery pack 12, wherein each component may perform a portion of the computations in serial or in parallel, as appropriate.

Figure 6:
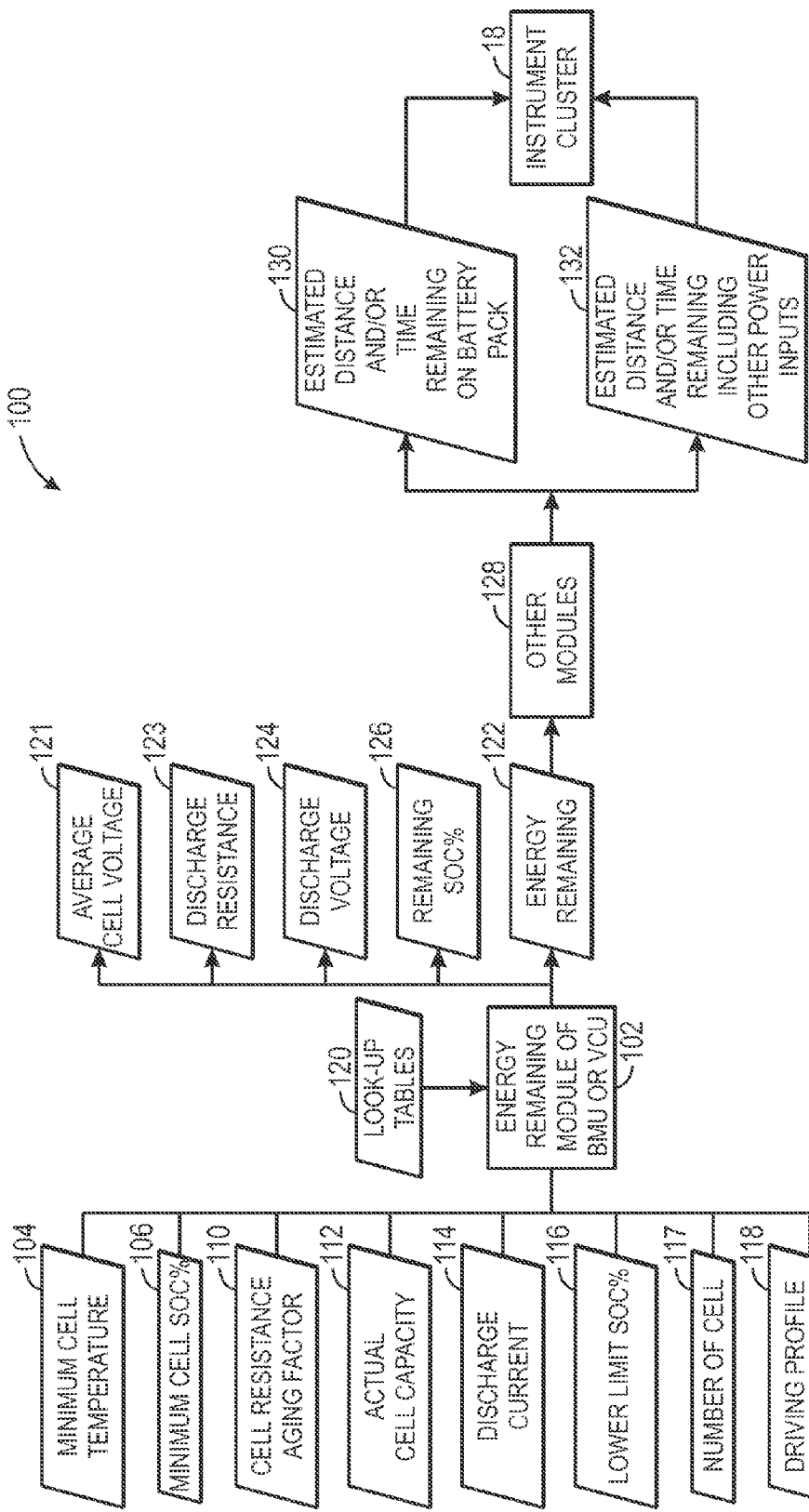
FIG. 6 is an information flow diagram illustrating data inputs and outputs for the energy remaining module executed by the BMU and/or VCU, in accordance with an embodiment of the present technique.

Referring now to FIG. 6, an information flow diagram 100 illustrates various inputs and outputs to an embodiment of the energy remaining module 102 that may be executed by the BMU 14 and/or the VCU 16 (e.g., memory 72 and/or 84, processors 74 and/or 86). It should be appreciated that, in certain embodiments, the energy remaining module 102 implemented as a hardware module (e.g., digital and/or analog) within the BMU and/or VCU, or may be a software module executed by at least one processor (e.g., processor 74 and/or 86). The information flow diagram 100 illustrates the energy remaining module 102 receiving a number of inputs that corresponds to measured, calculated, and/or stored parameters corresponding to the battery pack 12. The illustrated inputs include: minimum cell temperature 104, minimum cell SOC % 106, battery pack temperature 108, cell resistance aging factor 110, actual cell capacity 112, discharge current 114, lower limit SOC % 116, number of cells 117, and a driving profile weighting factor 118. Furthermore, the illustrated energy remaining module 102 also receive data input from one or more look-up tables 120. These various inputs may be stored in memories 72 and/or 84 such that the processors 74 and/or 86 may access this information when performing the calculations, as set forth below, within the energy remaining module.

Furthermore, the energy remaining module 102 illustrated in FIG. 6 outputs an energy remaining value 122 (e.g., in kilowatt-hours (kWh), joules, calories, or other suitable unit). Additionally, in doing so, the BMU 14 and/or the VCU 16 may also determine other values for the battery pack 12 (e.g., average cell voltage 121, discharge resistance 123, discharge voltage 124, and remaining SOC % 126) that may be also stored in memories 72 and/or 84 or communicated to another device for later use. It should be appreciated that, in certain embodiments, the BMU 14 and/or VCU 16 may determine one or more of these intermediate values (e.g., average cell voltage 121 and/or discharge resistance 123) based, at least in part, on the one or more look-up tables 120. As illustrated by the information flow diagram 100, other modules 128 (e.g., other modules executed by the BMU 14 or the VCU 16) may use one or more outputs of the energy remaining module 102 (e.g., the energy remaining value 122) to perform other calculations. For example, other modules of the VCU 16 (e.g., stored in memory 84 and executing on processor 86) may utilize the energy remaining value 122 calculated by the BMU 14 and/or VCU 16 to determine, for example, an estimated range 130 remaining for the xEV using the battery pack 12 alone (e.g., in distance and/or time), an estimated range 132 remaining for the xEV (e.g., in distance and/or time) using the battery pack 12 and other power inputs (e.g., the fuel of the internal combustion engine 42 of the HEV 40 illustrated in FIG. 3). The estimated ranges 130 and/or 132 may be communicated to the instrument cluster 18 for display to the driver (e.g., using range gauge 30 of instrument cluster 18).

Figure 7:
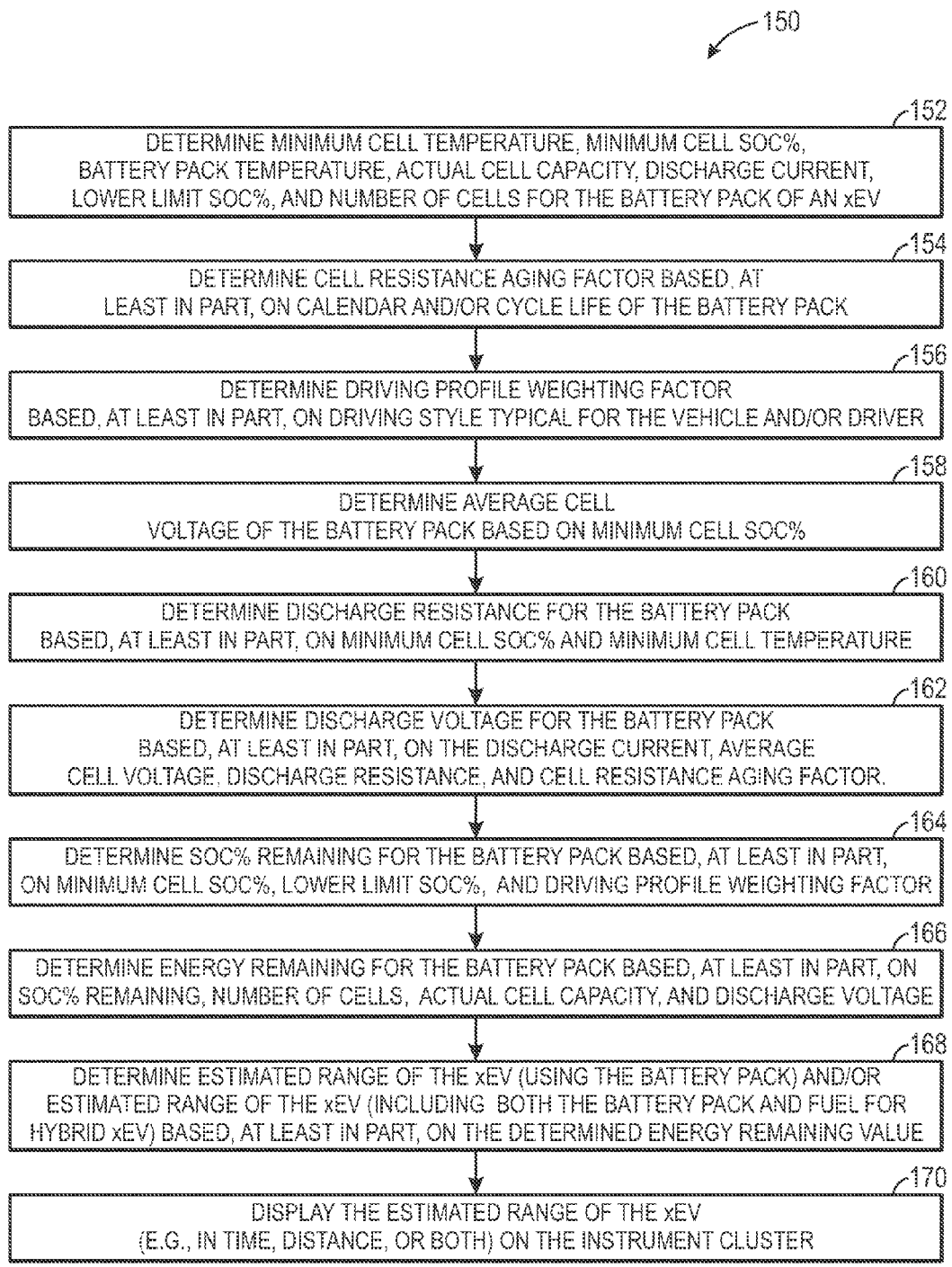
FIG. 7 is a flow diagram illustrating a process by which the energy remaining module may determine the energy remaining in a battery pack of an xEV, in accordance with an embodiment of the present technique.

With the foregoing in mind, FIG. 7 illustrates an embodiment of a process 150 whereby the BMU 14 and/or the VCU 16 may determine (e.g., estimate or predict) the energy remaining in the battery pack 12 of an xEV (e.g., xEV 10 or HEV 40). That is, the process 150 illustrated in FIG. 7 may be implemented as hardware or encoded as a series of instructions that may be stored in at least one memory (e.g., memory 72 and/or 84) and may be executed by at least one processor (e.g., processor 74 and/or 86) to determine the energy remaining in the battery pack 12. It should be appreciated that, in other embodiments, the steps illustrated in the process 150 may be performed in other orders. Furthermore, in certain embodiments, the certain steps of the process 150 may be implemented in parallel or in a serialized fashion. Further, in certain embodiments, certain steps may be executed by a first processor (e.g., processor 74) while other steps may be executed by a second processor (e.g., processor 84).

The illustrated process 150 begins when the processor (e.g., processor 74 and/or 86) determines (block 152) a number of monitored, measured, and/or stored parameters for the battery pack 12, including, for example, minimum cell temperature 104, battery pack temperature 108, actual cell capacity 112, discharge current 114, lower limit SOC % 116, number of cells 117, or any other suitable information regarding the battery pack 12. For example, certain parameters, such as lower limit SOC % 116 and number of cells 117, may be determined by the manufacturer of the battery pack and/or xEV and stored in memory (e.g., memory 72 and/or 84) when the battery pack 12 is installed in the xEV. Other parameters, such as, for example, minimum cell temperature 104, and actual cell capacity 112, may be determined by the processor (e.g., processor 74 and/or 86) based upon information received from one or more cell supervisory controller 76 disposed about the battery pack 12 (as illustrated in FIG. 5). Furthermore, in embodiments where the VCU 16 executes the energy remaining module 102, one or more of the above-referenced parameters may be supplied to the memory 84 and processor 86 of the VCU 16 by the BMU 14 for the computation.

Additionally, the processor (e.g., processor 74 and/or 86) may also determine (block 154) other parameters of the battery pack 12, such as the cell resistance aging factor, which may be determined based on the calendar and/or cycle life of the battery pack 12, or based on a real time aging determination algorithm. For example, in certain embodiments, the cell resistance aging factor may be a real or integer number that is initially set to 1 at the BOL of the battery pack 12, and the value may grow to approximately 2 near the end of life (EOL) of the battery pack 12. As such the cell resistance aging factor may allow the energy remaining module 102 to consider the changing resistance portions of the battery pack 12 over the life of the battery pack 12 when executing the energy remaining module 102.

Next in the process 150 illustrated in FIG. 7, the processor (e.g., processor 74 and/or 86) may determine (block 156) a driving profile weighting factor based on the driving style typical for the vehicle and/or driver. For example, in certain embodiments, the driving profile weighting factor may be a real number that may range from 2, which may correspond to a highly economical, non-aggressive driving style, to approximately 0.5, which may correspond to a highly aggressive driving style (e.g., prone to sudden acceleration and deceleration). In certain embodiments, the driving profile weighting factor may correspond to a particular driver of the xEV, while in other embodiments, the driving profile weighting factor may represent a typical or average the driving style experienced by the xEV. In certain embodiments, the driving profile weighting factor may also consider the type of driving typically experienced by the xEV (e.g., highway driving, stop-and-go driving, towing, etc.) Furthermore, in embodiments where the BMU 14 performs the energy remaining calculation, the processor 74 of the BMU 14 may receive the driving profile weighting factor from the VCU 16, wherein the driving profile weighting factor may be computed by the processor 86 of the VCU 16.

The process 150 illustrated in FIG. 7 continues when the processor (e.g., processor 74 and/or 86) determines (block 158) an average cell voltage 121 for the battery pack 12 based, at least in part, on the minimum cell SOC % 106. For example, in certain embodiments, the processor (e.g., processor 74 and/or 86) executing the energy remaining module may utilize one or more look-up tables stored in a memory (e.g., memory 72 and/or 84), such as a lookup table that relates the determined minimum cell SOC % 106 to an average cell voltage 121 for the battery pack 12. For example, the processor may utilize a look-up table similar to Table 1 set forth below. As such, for example, providing a minimum cell SOC % input value of 80% results and an average cell voltage output of 3605 mV, and providing a minimum cell SOC % input value of 35% results and an average cell voltage output of 3481 mV. In other embodiments, the processor may instead utilize one or more equations or formulas relating the minimum cell SOC % and the average cell voltage in order to determine the average cell voltage for the battery pack 12.

TABLE 1

Minimum Cell SOC % vs. Average Cell Voltage.

| Minimum SOC % | Average Cell Voltage (mV) |
|---|---|
| 95% | 3653 |
| 90% | 3637 |
| 85% | 3621 |
| 80% | 3605 |
| 75% | 3589 |
| 70% | 3573 |
| 65% | 3558 |
| 60% | 3543 |
| 55% | 3531 |
| 50% | 3519 |
| 45% | 3507 |
| 40% | 3495 |
| 35% | 3481 |
| 30% | 3467 |
| 25% | 3450 |
| 20% | 3432 |
| 15% | 3413 |
| 12% | 3397 |
| 10% | 3386 |

The next step in the process 150 illustrated in FIG. 7 involves the processor (e.g., processor 74 and/or 86) determining (block 158) the discharge resistance 123 for the battery pack 12 based, at least in part, on the minimum cell temperature 104 and minimum cell SOC % 106. For example, in certain embodiments, the processor (e.g., processor 74 and/or 86) executing the energy remaining module may utilize one or more look-up tables stored in a memory (e.g., memory 72 and/or 84), such as a lookup table that relates the determined minimum cell temperature 104 and minimum cell SOC % 106 to the discharge resistance 123 for the battery pack 12. For example, the processor may utilize a look-up table similar to Table 2 set forth below. As such, for example, providing a minimum cell SOC % input value of 80% and a minimum cell temperature of 45° C. results and a cell discharge resistance of 2.26 miliohms (mOhm). Similarly, providing a minimum cell SOC % input value of 35% and a minimum cell temperature of −10° C. results and an average cell resistance output of 10.57 mOhm. In other embodiments, the processor may instead utilize one or more equations or formulas relating the minimum cell temperature 104, minimum cell SOC % 106, and discharge resistance in order to determine the discharge resistance for the battery pack 12.

TABLE 2

Minimum Cell SOC % vs. Minimum cell temperature vs. Discharge resistance.

| | Minimum Cell Temperature | | | | |
|---|---|---|---|---|---|
| Minimum SOC % | 45° C. | 25° C. | −10° C. | −20° C. | −30° C. |
| 95% | 2.32 | 2.39 | 10.67 | 11.04 | 24.78 |
| 90% | 2.31 | 2.39 | 10.63 | 11.04 | 24.87 |
| 85% | 2.29 | 2.36 | 10.58 | 11.06 | 25.13 |
| 80% | 2.26 | 2.34 | 10.52 | 11.09 | 25.51 |
| 75% | 2.24 | 2.33 | 10.48 | 11.15 | 26.11 |
| 70% | 2.22 | 2.31 | 10.42 | 11.24 | 26.90 |
| 65% | 2.21 | 2.30 | 10.38 | 11.37 | 27.84 |
| 60% | 2.24 | 2.32 | 10.38 | 11.59 | 29.17 |
| 55% | 2.30 | 2.39 | 10.41 | 11.92 | 30.86 |
| 50% | 2.39 | 2.47 | 10.46 | 12.36 | 33.03 |
| 45% | 2.47 | 2.56 | 10.52 | 12.93 | 35.69 |
| 40% | 2.54 | 2.63 | 10.56 | 13.68 | 39.36 |
| 35% | 2.59 | 2.68 | 10.57 | 14.73 | 44.46 |
| 30% | 2.60 | 2.69 | 10.56 | 16.29 | 51.83 |
| 25% | 2.56 | 2.66 | 10.49 | 18.90 | 64.21 |
| 20% | 2.47 | 2.57 | 10.37 | 24.21 | 88.36 |
| 15% | 2.37 | 2.47 | 10.24 | 40.50 | 87.87 |
| 12% | 2.25 | 2.35 | 10.10 | 87.48 | 87.48 |

In certain embodiments, the contents of the look-up tables may be based on the results of performance testing of the battery pack 12 at the time of manufacturing. It should be appreciated, therefore that the values in the look-up tables (e.g., Tables 1 and 2) may be based on one or more assumptions (e.g., based on the testing conditions). For example, the illustrated Tables 1 and 2 may be generated based on an assumed discharge current of approximately 39 A and a 1 C discharge rate, wherein a 1 C discharge rate is the rate that would deplete the battery pack 12 in 1 hour at the stated discharge current. It should be appreciated that, in other embodiments, when performing a look-up operation (e.g., as describe above with respect to blocks 158 and 160) the energy remaining module 102 may determine a particular look-up table (e.g., out of a collection of look-up tables) to use based on one or more parameters of the battery pack 12. For example, Tables 1 and 2 may be used by the energy remaining module 102 when the discharge current 114 is approximately 39 A. However, when the discharge current 114 is not approximately 39 A, the energy remaining module 102 may utilize different look-up tables, similar in structure to Tables 1 and 2, but populated using data from testing the battery pack 12 when a different value is used for the discharge current 114 (e.g., 20 A) and/or a different discharge rate (e.g., 2 C or 3 C) is used. Further, in other embodiments, when a discharge current 114 and/or the discharge rate does not appear to match the assumed values used to generate the data in the available look-up tables (e.g., Tables 1 and 2), the energy remaining calculation may be performed using the data of Tables 1 and 2, and an adjustment factor may be applied (e.g., to the discharge voltage 124, the remaining SOC % 126, and/or the energy remaining value 122) to correct the values resulting during the energy remaining calculation.

Continuing the process 150 illustrated in FIG. 7, the processor (e.g., processor 74 and/or 86) may determine (block 162) the discharge voltage 124 for the battery pack 12 based, at least in part, on the discharge current 114 (e.g., as determined in block 152), average cell voltage 121 (e.g., as determined in block 158), discharge resistance 123 (e.g., as determined in block 160), and the cell resistance aging factor 110 (e.g., as determined in block 154). In certain embodiments, the processor may use an equation, such as Eq. 1 set forth below, to calculate the discharge voltage 124 from the aforementioned parameters of the battery pack 12.

$$\text{Discharge\_Voltage} = (\text{Average\_Cell\_Voltage} - \text{Cell\_Resistance\_Aging\_Factor} * \text{Discharge\_Resistance} * \text{Discharge\_Current})/1000 \qquad \text{Eq. 1}$$

Next in the illustrated process 150, the processor (e.g., processor 74 and/or 86) may determine (block 164) SOC % remaining 126 for the battery pack 12 based, at least in part, on the minimum cell SOC % 106 (e.g., as determined in block 152), the lower limit SOC % 116 (e.g., as determined in block 152), and the driving profile weighting factor 118 (e.g., as determined in block 156). In certain embodiments, the processor may use an equation, such as Eq. 2 set forth below, to calculate the SOC % remaining 126 for the battery pack 12 from the aforementioned parameters of the battery pack 12.

$$\text{SOC \%\_Remaining} = (\text{Minimum\_SOC \%} - \text{Lower\_Limit\_SOC \%}) * \text{Driving\_Profile\_Weighting\_Factor} \qquad \text{Eq. 2}$$

Continuing through the process 150, next, the processor (e.g., processor 74 and/or 86) may determine (block 156) the energy remaining 122 in the battery pack 12 based, at least in part, on the SOC % remaining 126 (e.g., as determined in block 164), the number of cells 117 (e.g., as determined in block 152), the actual cell capacity 112 (e.g., as determined in block 152), and the discharge voltage 124 (e.g., as determined in block 162). In certain embodiments, the processor may use an equation, such as Eq. 3 set forth below, to calculate the energy remaining in the battery pack 12 from the aforementioned parameters of the battery pack 12. Furthermore, in certain embodiments, the energy remaining calculation may include a "sanity check," wherein if the determined energy remaining value is less than zero, the energy remaining value may be set to zero.

$$\text{Energy\_Remaining} = \text{SOC \%\_Remaining} * \text{Number\_Of\_Cells} * \text{Actual\_Cell\_Capacity} * \text{Discharge\_Voltage}/1000 \qquad \text{Eq. 3}$$

The next step in the process 150 illustrated in FIG. 7, involves a processor of the xEV (e.g., processor 74 and/or 86) determining (block 168) an estimated range of the xEV based, at least in part, on the determined energy remaining value 122 (e.g., as determined in block 166). That is, after the BMU 14 and/or the VCU 16 have determine the energy remaining value 122 for the battery pack 12, a processor (e.g., processor 86 or 90) of the xEV may use the determined energy remaining value 122 to determine other parameters of the battery pack 12 and/or the xEV. For example, as set forth above with respect to FIG. 6, other modules (e.g., stored in memory 84 of the VCU 16 and executing on processor 86) may utilize the energy remaining value 122 calculated by the BMU 14 and/or VCU 16 to determine, for example, an estimated range 130 remaining for the xEV using the battery pack 12 alone or an estimated range 132 remaining for the xEV including other power inputs (e.g., the fuel of the internal combustion engine 42 of the HEV 40 illustrated in FIG. 3). By specific example, the VCU 16 may determine (e.g., estimate or predict) that the energy remaining of the battery pack 12 may be sufficient to travel an additional 30 miles and/or 25 minutes. Further, in hybrid xEV embodiments, the VCU 16 may further determine (e.g., estimate or predict) that the energy remaining in the hydrocarbon fuel in the fuel tank may be sufficient to travel an additional 40 miles and/or 35 minutes.

The final step in the illustrated process 150 is displaying (block 170) the estimated range of the xEV (e.g., in time, distance, or both) on the instrument cluster 18. That is, once the VCU 16 has used the energy remaining value 122 to estimate the range of the xEV (e.g., in terms of distance and/or time, with or without other energy inputs), the VCU 16 may communicate the determined range values to the driver via the instrument cluster 18 and/or range gauge 30. For example, based on the calculations of the VCU 16, the VCU 16 may instruct the instrument cluster 18 (e.g., the range gauge 30 of the instrument cluster 18) to indicate to the driver that that the energy remaining of the battery pack 12 may be sufficient to travel an additional 40 miles and/or 30 minutes. In hybrid xEV embodiments, the VCU 16 may instruct the instrument cluster 18 to display to the driver that the energy remaining in the hydrocarbon fuel in the fuel tank may be sufficient to travel an additional 20 miles and/or 10 minutes. Further, the VCU 16 may instruct the instrument cluster 18 to, additionally or alternatively, display that the total range of the xEV (using both the battery pack 12 and fuel) may be 60 miles and/or 40 minutes may be possible using a combination of the battery pack 12 and the fuel in the fuel tank.

Set forth below are example calculations of the energy remaining 112 in a battery pack 12 using the process 150 set forth in FIG. 7. In the first example, the energy remaining module 102 may determine for the battery pack 12 a minimum cell temperature 104 of about −10° C., a minimum cell SOC % of 106 of 95%, a lower limit SOC % 116 of 10%, a discharge current 114 of about 39 A, an actual cell capacity 112 of about 39 Ah, and 96 as the number of cells 117 (e.g., in block 152). The energy remaining module 102 may also determine the cell resistance aging factor to be about 1 (e.g., a newer battery pack), based on the calendar and cycle life of the battery module (e.g., in block 154). The energy remaining module 102 may additionally determine the driving profile weight factor based on driving style to be about 1 (e.g., in block 156). Using this data, the energy remaining module 102 may determine (e.g., in block 158) that the average cell voltage 121 is 3653 mV (e.g., using Table 1 as a look-up table). Further, the energy remaining module 102 may determine (e.g., in block 160) that the discharge resistance 123 for the battery pack 12 is about 10.67 mOhm (e.g., using Table 2 as a lookup-table).

Continuing the first example, using the above data and calculations, the energy remaining module 102 may then determine the discharge voltage 124 of the battery pack 12 to be about 3.237 V (e.g., in block 162). Additionally, the energy remaining module 102 may determine the SOC % remaining 126 to be 85% (e.g., in block 164). Finally, these values may subsequently be used by the energy remaining module 102 to determine an energy remaining value 122 of about 10.3 KWh (e.g., in block 166). The energy remaining value 122 may then by output to the VCU 16 (e.g., for further computations) and/or the instrument cluster 18 for display on the instrument cluster and/or center console, as described above. Furthermore, as set forth above, the energy remaining value 122 determined by the energy remaining module 102 may subsequently be used by other portions of the xEV (e.g., other modules 128 of the VCU 16) to determine an estimated range 130 possible for the xEV using the energy remaining 122 in the battery pack 12 and/or an estimated range 132 possible for the xEV using both the energy remaining 122 and the battery pack 12 and other fuel sources, as discussed in block 168. Finally, the estimated ranges 130 and/or 132 of the xEV may be communicated to the instrument cluster 18 (e.g., range gauge 30) for display (e.g., in block 170) to the driver.

In a second example using the process 150 set forth in FIG. 7, the energy remaining 122 may be determined for same battery pack 12 used in the previous example, but after the battery pack 12 has aged. Accordingly, while certain parameters (e.g., number of cells 117 and lower limit SOC % 116) of the battery pack 12 remain constant throughout the life the battery pack 12, other parameters of the battery pack 12 may shift over time. As such, for the second example, the cell resistance aging factor 110 may instead have a value of about 1.5. Further, the actual cell capacity 112 may be adjusted to about 31 Ah (e.g., representing a 20% reduction). Using these values, the discharge voltage 124 of the battery pack 12 in the second example becomes approximately 3.028 V (e.g., as determined in block 162). Therefore, for the second example, the energy remaining value 122 for the battery pack 12 is about 7.7 KWh (e.g., as determined in block 166). As for the example above, the VCU 16 may subsequently calculate one or more ranges (e.g., in block 168) for the xEV based, at least in part, on the determined energy remaining value 122 for later display to the driver (e.g., in block 170). It should be appreciated that, the present approach enables the calculation of the remaining energy in the battery pack 12 at any particular time between the BOL and EOL of the battery pack.

Figure 8:
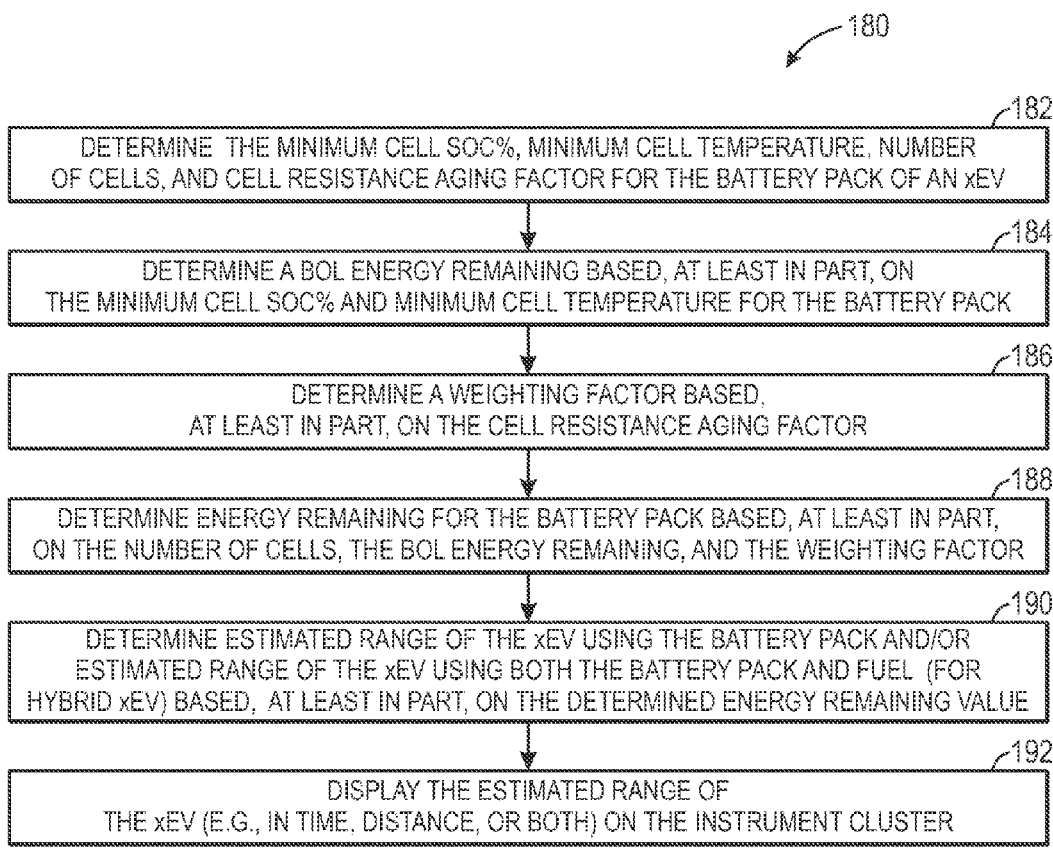
FIG. 8 is a flow diagram illustrating an alternative process by which the energy remaining module may determine the energy remaining in a battery pack of an xEV based on a corrected beginning of life (BOL) energy remaining value, in accordance with an embodiment of the present technique.

FIG. 8 illustrates an alternative process 180 the BMU 14 and/or VCU 16 may use for the energy remaining module 102 to determine the energy remaining 122 in the battery pack 12. The process 180 begins when the processor (e.g., processor 74 and/or 86) determines (block 182) the minimum cell SOC % 106, minimum cell temperature 104, number of cells 117, and cell resistance aging factor 110 for the battery pack 12 of the xEV (e.g., xEV 10 or HEV 40). In contrast to the process 150, next the processor determines (block 184) a BOL energy remaining forth the battery pack 12 based, at least in part, on the minimum cell SOC % 106 and minimum cell temperature 104 of the battery pack 12. For example, in certain embodiments, the processor (e.g., processor 74 and/or 86) executing the energy remaining module 102 may utilize one or more look-up tables stored in a memory (e.g., memory 72 and/or 84), such as a look-up table that relates the determined minimum cell SOC % 106 and minimum cell temperature 104 to the BOL energy remaining for the battery pack 12. For example, the processor may utilize a look-up table similar to Table 3 set forth below. It should be appreciated that, Table 3 may be an example of one of a number of look-up tables in memory (e.g., memory 72 and/or 84). Furthermore, the data contained in Table 3 may be generated based testing of the battery pack 12 under a number of assumed conditions (e.g., a particular discharge rate, a particular discharge current, a particular number of cells, etc.). Accordingly, in certain embodiments, the appropriate lookup table may be selected from a collection of look-up tables in memory based upon any monitored parameter of the battery pack 12 (e.g., discharge rate, discharge current, and so forth).

TABLE 3

Minimum Cell SOC % vs. minimum cell temperature vs. BOL energy remaining (KWh).

| Minimum SOC % | Minimum Cell Temperature | | | | |
|---|---|---|---|---|---|
| | 45° C. | 25° C. | −10° C. | −20° C. | −30° C. |
| 95% | 11.34 | 11.33 | 10.30 | 10.26 | 8.55 |
| 90% | 10.62 | 10.61 | 9.65 | 9.60 | 7.99 |
| 85% | 9.92 | 9.91 | 9.01 | 8.96 | 7.42 |
| 80% | 9.22 | 9.21 | 8.37 | 8.31 | 6.84 |
| 75% | 8.52 | 8.51 | 7.74 | 7.68 | 6.26 |
| 70% | 7.83 | 7.82 | 7.11 | 7.04 | 5.67 |
| 65% | 7.15 | 7.14 | 6.49 | 6.41 | 5.09 |
| 60% | 6.47 | 6.46 | 5.88 | 5.79 | 4.50 |
| 55% | 5.80 | 5.79 | 5.26 | 5.17 | 3.92 |
| 50% | 5.13 | 5.13 | 4.66 | 4.55 | 3.34 |
| 45% | 4.47 | 4.46 | 4.06 | 3.93 | 2.77 |
| 40% | 3.81 | 3.81 | 3.46 | 3.33 | 2.20 |
| 35% | 3.16 | 3.16 | 2.87 | 2.72 | 1.64 |
| 30% | 2.52 | 2.52 | 2.29 | 2.12 | 1.08 |
| 25% | 1.88 | 1.88 | 1.71 | 1.52 | 0.53 |
| 20% | 1.25 | 1.25 | 1.13 | 0.93 | −0.01 |
| 15% | 0.62 | 0.62 | 0.56 | 0.34 | 0.00 |
| 12% | 0.19 | 0.19 | 0.17 | 0.00 | 0.00 |
| 10% | 0.00 | 0.00 | 0.00 | 0.00 | 0.00 |

Next in the process 180 illustrated in FIG. 8, the processor (e.g., processor 74 and/or 86) determines (block 186) a weighting factor based, at least in part, on the cell resistance aging factor 110. For example, the weighting factor may be real number (e.g., between 0 and 1) that may initially be equal to 1 at the BOL of the battery pack 12. As the battery pack 12 ages, and the resistance within the battery increases, the weighting factor may generally decrease. For example, once the resistance of the battery has increased by approximately 1.5×, and the actual capacity of the battery pack is reduced to 80% of its original capacity, the weighting factor may be approximately 77%. In certain embodiments, the weighting factor may be calculated based, at least in part, on the driving profile weighting factor, the calendar and/or cycle life of the battery pack 12, and/or a projection for the remaining period of xEV use.

The next step in the process 180 illustrated in FIG. 8 involves the processor (e.g., processor 74 and/or 86) determining (block 188) the remaining energy for the battery pack based, at least in part, on the number of cells 117, the BOL energy remaining (e.g., as determined in block 184), and the weighting factor (e.g., as determined in block 186). In certain embodiments, the processor may utilize the Eq. 3 set forth below to determine the energy remaining $$\text{Energy\_Remaining} = \text{Weighting\_Factor} * \text{Number\_Of\_Cells} * \text{BOL\_Energy\_Remaining}. \quad \text{Eq. 3}$$

The next step in the process 180 illustrated in FIG. 8, involves a processor of the xEV (e.g., processor 74 and/or 86) determining (block 190) an estimated range of the xEV based, at least in part, on the determined energy remaining value 122 (e.g., as determined in block 188). That is, after the BMU 14 and/or the VCU 16 have determine the energy remaining value 122 for the battery pack 12, a processor (e.g., processor 86 or 90) of the xEV may use the determined energy remaining value 122 to determine other parameters of the battery pack 12 and/or the xEV. For example, as set forth above with respect to FIG. 6, other modules (e.g., stored in memory 84 of the VCU 16 and executing on processor 86) may utilize the energy remaining value 122 calculated by the BMU 14 and/or VCU 16 to determine, for example, an estimated range 130 (e.g., in distance and/or time) remaining for the xEV using the battery pack 12 alone or an estimated range 132 (e.g., in distance and/or time) remaining for the xEV including other power inputs (e.g., the fuel of the internal combustion engine 42 of the HEV 40 illustrated in FIG. 3).

The final step in the illustrated process 180 is displaying (block 192) the estimated range of the xEV (e.g., in time, distance, or both) on the instrument cluster 18. That is, once the VCU 16 has used the energy remaining value 122 to estimate the range of the xEV (e.g., in terms of distance and/or time, with or without other energy inputs), the VCU 16 may communicate the determined range values to the driver via the instrument cluster 18 and/or range gauge 30. For example, based on the calculations of the VCU 16, the VCU 16 may instruct the instrument cluster 18 (e.g., the range gauge 30 of the instrument cluster 18) to indicate to the driver that that the energy remaining of the battery pack 12 may be sufficient to travel a certain distance and/or time. For hybrid xEV embodiments, the VCU 16 may further instruct the instrument cluster 18 to display to the driver the remaining range 132 (e.g., in distance and/or time) for the xEV using both the battery pack 12 and the hydrocarbon fuel in the fuel tank.

Set forth below is an example to demonstrate using the process 180 to determine the energy remaining for a battery pack 12. First, the processor (e.g., processor 74 and/or 86) determines a minimum cell SOC % of 70% and a minimum cell temperature of 25° C. for a 96 cell battery pack 12 (e.g., as in block 182). Using Table 3 and these values, a BOL energy remaining of 7.82 KWh of 96 cell battery pack may be determined (e.g., as in block 184). Further, the processor may determine a weighting factor of 77% (e.g., as in block 186) for the battery pack 12 based, at least in part, on the cell resistance aging factor 110, as set forth above. Next, the processor may determine an energy remaining of approximately 6 KWh. The VCU 16 may then determine (e.g., based on the current rate of travel, rate of discharge of the battery, or other conditions) that the remaining range of the xEV using the battery pack 12 is, for example, approximately 50 miles (e.g., in block 190). Subsequently, the VCU 16 may instruct the instrument cluster 18 (e.g., range gauge 30) to display (e.g., in block 192) this estimated range of the xEV (e.g., in distance, time, or both).

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A battery management unit (BMU) system communicatively coupled to a plurality of sensors respectively associated with a plurality of battery cells of a battery pack of an xEV, wherein the BMU system is configured to:
receive, from the plurality of sensors, a first plurality of signals and a second plurality of signals, wherein each of the first plurality of signals is indicative of a present temperature of a respective one of the plurality of battery cells and wherein each of the second plurality of signals is indicative of a present state of charge (SOC) of the respective one of the plurality of battery cells;
determine a plurality of temperatures based on the first plurality of signals, wherein each of the plurality of temperatures respectively corresponds to a present battery cell temperature of a single battery cell of the plurality of battery cells;
determine a plurality of SOC percentages based on the second plurality of signals, wherein each of the plurality of SOC percentages respectively corresponds to a present SOC percentage of a single one of the plurality of battery cells;

determine a lowest cell temperature from the plurality of temperatures and a lowest cell SOC percentage from the plurality of SOC percentages; and determine an energy remaining value for the battery pack based on the lowest cell temperature and the lowest cell SOC percentage.

2. The BMU system of claim 1, wherein the BMU system is configured to provide the determined energy remaining value to a vehicle control unit (VCU) that controls operation of the xEV, and wherein the VCU is configured to determine a range remaining for the xEV in distance, time, or both, based, at least in part, on the energy remaining value provided by the BMU system.

3. The BMU system of claim 2, wherein the VCU is configured to instruct an instrument cluster to display the range remaining for the xEV in distance, time, or both.

4. The BMU system of claim 1, wherein the BMU system is configured to use one or more look-up tables to determine the energy remaining value.

5. The BMU system of claim 4, wherein the one or more look-up tables comprise at least one table relating the lowest cell SOC percentage to an average cell voltage of the battery pack.

6. The BMU system of claim 4, wherein the one or more look-up tables comprise at least one table relating both the lowest cell SOC percentage and the lowest cell temperature to a discharge resistance of the battery pack.

7. The BMU system of claim 4, wherein the one or more look-up tables comprise at least one table relating both the lowest cell SOC percentage and the lowest cell temperature to a beginning of life (BOL) energy remaining value for the battery pack.

8. The BMU system of claim 7, wherein the BMU system is configured to determine the energy remaining value for the battery pack using the BOL energy remaining value and a weighting factor.

9. The BMU system of claim 8, wherein the weighting factor is based on a calendar or cycle life of the battery pack or based on a real-time aging determination algorithm.

10. The BMU system of claim 1, wherein the BMU system is configured to determine the energy remaining value using an average cell voltage, a discharge resistance, a discharge voltage, and a remaining SOC percentage of the battery pack.

11. The BMU system of claim 1, wherein the BMU system is configured to determine the energy remaining value using a cell capacity, a number of battery cells, a discharge current, and a lower limit SOC percentage of the battery pack.

12. The BMU system of claim 1, wherein the BMU system is configured to determine the energy remaining value using a cell resistance aging factor that is based on a calendar or cycle life of the battery pack or based on a real time aging determination algorithm.

13. The BMU system of claim 1, wherein the BMU system determines the energy remaining value using a driving profile weighting factor that is based on a driving style typical for the xEV to experience.

14. A system, comprising:
a battery pack for an xEV, comprising:
a plurality of electrochemical cells;
a plurality of sensors respectively associated with the plurality of electrochemical cells and configured to generate a first plurality of signals and a second plurality of signals, wherein each of the first plurality of signals is indicative of a present temperature of a respective one of the plurality of electrochemical cells and wherein each of the second plurality of signals is indicative of a present state of charge (SOC) percentage of a single one of the plurality of electrochemical cells; and a battery management unit (BMU) coupled to the battery pack and the plurality of sensors and configured to:
determine a plurality of temperatures based on the first plurality of signals, wherein each of the plurality of temperatures corresponds to a present cell temperature of a single electrochemical cell;

determine a plurality of SOC percentages based on the second plurality of signals, wherein each of the plurality of SOC percentages corresponds to a present SOC percentage of a single one of the plurality of electrochemical cells;

determine a lowest cell temperature from the plurality of temperatures and a lowest cell SOC percentage from the plurality of SOC percentages; and determine an energy remaining in the plurality of electrochemical cells using the lowest cell temperature and the lowest cell SOC percentage.

15. The system of claim 14, wherein the BMU is configured to determine the energy remaining in the plurality of electrochemical cells using a cell resistance aging factor that is based on a calendar or cycle life of the plurality of electrochemical cells or based on a real time aging determination algorithm.

16. The system of claim 14, wherein the BMU is configured to determine or receive a driving profile weighting factor from a vehicle control unit (VCU) that controls operation of the xEV, and configured to use the driving profile weighting factor to determine the energy remaining in the plurality of electrochemical cells.

17. The system of claim 16, wherein the BMU is configured to communicate to the VCU a value corresponding to the energy remaining in the plurality of electrochemical cells.

18. The system of claim 17, wherein the VCU is configured to receive, from the BMU, the value corresponding to the energy remaining in the plurality of electrochemical cells, and configured to use the value to determine a time, a distance, or a combination thereof, that the xEV may travel by consuming the remaining energy in the plurality of electrochemical cells.

19. The system of claim 18, wherein the VCU is configured to instruct an instrument cluster to display the time, the distance, or a combination thereof, that the xEV may travel by consuming the remaining energy in the plurality of electrochemical cells.

20. An xEV, comprising:
a battery pack having a plurality of battery cells and configured to supply electrical power to propel the xEV;
a battery management unit (BMU) configured to monitor and control the battery pack; and
a vehicle control unit (VCU) communicatively coupled to the BMU, wherein the BMU, the VCU, or a combination thereof, is configured to:
determine a plurality of temperatures, wherein each of the plurality of temperatures corresponds to a present battery cell temperature of a single battery cell;

determine a plurality of state of charge (SOC) percentages, wherein each of the plurality of SOC percentages corresponds to a present SOC percentage of a single one of the plurality of battery cells; and determine an energy remaining value for the battery pack based on only a lowest cell temperature of the plurality of temperatures and only a lowest SOC percentage of the plurality of SOC percentages.

21. The system of claim 20, wherein the VCU is configured to determine a remaining range of the xEV using the determined energy remaining value and configured to instruct an instrument cluster to display the determined remaining range of the xEV.

22. The system of claim 20, comprising an internal combustion engine, a generator, and a fuel tank storing fuel, wherein the internal combustion engine is configured to combust the fuel from the fuel tank to power the generator, and wherein the generator is configured supply electrical power to the battery pack.

23. The system of claim 22, wherein the VCU is configured to determine an amount of energy that the fuel in the fuel tank of the xEV will provide to the battery pack when the fuel is combusted by the internal combustion engine.

24. The system of claim 23, wherein the VCU is configured to determine a remaining range of the xEV based, at least in part, on the determined energy remaining value for the battery pack and the determined amount of energy that the fuel from the fuel tank of the xEV will provide and configured to instruct an instrument cluster to display the determined remaining range of the xEV.

25. A method, comprising:
determining an amount of energy remaining in a battery pack of an xEV, wherein the battery pack comprises a plurality of cells, and wherein the amount of energy remaining in the battery pack is determined using a discharge voltage of the battery pack, a state of charge (SOC) percentage remaining for the battery pack, a number of the plurality of cells in the battery pack, and an actual cell capacity of each of the plurality of cells of the battery pack.

26. The method of claim 25, comprising determining the SOC percentage remaining for the battery pack using a SOC percentage lower limit of the battery pack, a driving profile weighting factor, and a lowest cell SOC percentage of a plurality of SOC percentages, wherein each of the plurality of SOC percentages corresponds to a present SOC percentage of a single one of the plurality of battery cells.

27. The method of claim 26, wherein the driving profile weighting factor is based on a driving style experienced by the xEV.

28. The method of claim 25, comprising determining the discharge voltage of the battery pack using an average cell voltage of the battery pack, a cell resistance aging factor of the battery pack, a discharge resistance of the battery pack, and a measured discharge current of the battery pack.

29. The method of claim 28, comprising determining the average cell voltage for the battery pack using a lowest measured cell SOC percentage of a plurality of SOC percentages, wherein each of the plurality of SOC percentages corresponds to a present SOC percentage of a single one of the plurality of cells.

30. The method of claim 29, wherein determining the average cell voltage of the battery pack comprises using a look-up table that correlates the lowest measured cell SOC percentage and the average cell voltage of the battery pack.

31. The method of claim 28, comprising determining the discharge resistance of the battery pack using:
a lowest cell SOC percentage of a plurality of SOC percentages, wherein each of the plurality of SOC percentages corresponds to a present SOC percentage of a single one of the plurality of cells; and
a lowest cell temperature of a plurality of cell temperatures, wherein each of the plurality of cell temperatures corresponds to a present cell temperature of a single cell of the plurality of cells.

32. The method of claim 31, wherein determining the discharge resistance of the battery pack comprises using a look-up table that correlates the lowest cell SOC percentage, the lowest cell temperature, and the discharge resistance of the battery pack.

33. The method of claim 28, comprising determining the cell resistance aging factor of the battery pack using a calendar or cycle life of the battery pack.

34. A method, comprising:
determining an amount of energy remaining in a battery pack that includes a plurality of cells, comprising:
receiving, from a plurality of sensors, a first plurality of signals and a second plurality of signals, wherein each of the first plurality of signals is indicative of a present temperature of a respective one of the plurality of battery cells and wherein each of the second plurality of cells is indicative of a present state of charge (SOC) of the respective one of the plurality of battery cells;
determining a plurality of measured cell temperatures based on the first plurality of signals, wherein each of the plurality of measured cell temperatures corresponds to a present cell temperature of a single cell of the plurality of cells;
determining a plurality of measured cell state of charge (SOC) percentages based on the second plurality of signals, wherein each of the plurality of measured cell SOC percentages corresponds to a present cell SOC percentage of a single one of the plurality of cells;
determining a lowest cell temperature from the plurality of measured cell temperatures and a lowest cell state of charge (SOC) percentage from the plurality of measured cell SOC percentages;
determining an average cell voltage of the battery pack using the lowest SOC percentage;
determining a discharge resistance of the battery pack using the lowest cell temperature and the lowest SOC percentage;
determining a discharge voltage of the battery pack using the average cell voltage of the battery pack;
determining a SOC percentage remaining for the battery pack using the lowest cell SOC percentage; and
determining the amount of energy remaining in the battery pack using the discharge voltage of the battery pack and the SOC percentage remaining for the battery pack.

35. The method of claim 34, wherein the discharge voltage of the battery pack is determined using the average cell voltage of the battery pack, the discharge resistance of the battery pack, a measured discharge current of the battery pack, and a cell resistance aging factor of the battery pack.

36. The method of claim 35, comprising using look-up tables to determine the average cell voltage and the discharge resistance of the battery using only the lowest cell temperature and the lowest cell SOC percentage as inputs.

37. The method of claim 35, comprising determining the cell resistance aging factor of the battery pack using a calendar or cycle life of the battery pack.

38. The method of claim 35, wherein the SOC percentage remaining for the battery pack is determined using the lowest cell SOC percentage, a SOC percentage lower limit of the battery pack, and a driving profile weighting factor.

39. The method of claim 38, comprising determining the driving profile weighting factor using information indicative of a typical driving style experienced by the xEV.

40. The method of claim 38, wherein the amount of energy remaining in the battery pack is determined using the discharge voltage of the battery pack, the SOC percentage remaining for the battery pack, a number of the plurality of cells of the battery pack, and an actual cell capacity of each of the plurality of cells of the battery pack.

41. A method, comprising:
  determining an amount of energy remaining in a battery pack of an xEV, wherein the battery pack comprises a plurality of cells, and wherein the amount of energy remaining is determined from a plurality of inputs consisting essentially of:
  a number of the plurality of cells in the battery pack;
  an actual cell capacity of each of the plurality of cells of the battery pack; a discharge current of the battery pack;
  a cell resistance aging factor of the battery pack;
  a driving profile weighting factor;
  a lowest state of charge (SOC) percentage of a plurality of SOC percentages, wherein each of the plurality of SOC percentages corresponds to a present SOC percentage of a single one of the plurality of cells; and
  a lowest cell temperature of a plurality of cell temperatures, wherein each of the plurality of cell temperatures corresponds to a present cell temperature of a single cell of the plurality of cells.

42. The method of claim 41, comprising measuring or estimating the actual cell capacity of each of the plurality of cells of the battery pack.

43. The method of claim 41, comprising measuring, estimating, or predetermining the discharge current of the battery pack.

44. The method of claim 41, comprising measuring the cell resistance aging factor of the battery pack or estimating the cell resistance aging factor of the battery pack based on a calendar or cycle life of the batter pack.

45. The method of claim 41, comprising determining the driving profile weighting factor based on a typical driving style experienced by the xEV.

46. A method, comprising:
  determining an amount of energy remaining in a battery pack of an xEV, wherein the battery pack comprises a plurality of cells, and wherein the amount of energy remaining is determined from a plurality of inputs consisting essentially of:
  a number of the plurality of cells in the battery pack;
  a weighting factor based on a calendar or cycle life of the battery pack;
  a lowest state of charge (SOC) percentage of a plurality of SOC percentages, wherein each of the plurality of SOC percentages corresponds to a present SOC percentage of a single one of the plurality of cells; and
  a lowest cell temperature of a plurality of cell temperatures, wherein each of the plurality of cell temperatures corresponds to a present cell temperature of a single cell of the plurality of cells.

\* \* \* \* \*